(12) United States Patent
Schäfer

(10) Patent No.: US 7,030,645 B2
(45) Date of Patent: Apr. 18, 2006

(54) METHOD FOR SETTING A TERMINATION VOLTAGE AND AN INPUT CIRCUIT

(75) Inventor: Andre Schäfer, Munich (DE)

(73) Assignee: Infineon Technologies AG, Munich (DE)

( * ) Notice: Subject to any disclaimer, the term of this patent is extended or adjusted under 35 U.S.C. 154(b) by 7 days.

(21) Appl. No.: 10/831,623

(22) Filed: Apr. 23, 2004

(65) Prior Publication Data

US 2005/0001650 A1 Jan. 6, 2005

(30) Foreign Application Priority Data

Apr. 24, 2003 (DE) ............................. 103 18 523

(51) Int. Cl.
*H03K 17/16* (2006.01)
(52) U.S. Cl. ........................... 326/30; 326/32; 326/33; 326/34
(58) Field of Classification Search ............ 326/30–34, 326/26–27; 327/108, 112
See application file for complete search history.

(56) References Cited

U.S. PATENT DOCUMENTS

| | | | |
|---|---|---|---|
| 4,638,473 A | * | 1/1987 | Cooperman et al. ........ 370/284 |
| 4,859,877 A | * | 8/1989 | Cooperman et al. .......... 326/30 |
| 5,528,168 A | * | 6/1996 | Kleveland ..................... 326/30 |
| 6,525,558 B1 | * | 2/2003 | Kim et al. ..................... 326/30 |

FOREIGN PATENT DOCUMENTS

DE   43 15 742 A1   11/1993
DE   100 20 142 A1   11/2001

OTHER PUBLICATIONS

Examination Report, Apr. 1, 2004.
Tietze-Schenk: Halbleiterschaltungstechnik, 11.Auflang, chapter 16.3.3 Spannungsregler mit einstellbarer Ausgangsspannung, p. 964, no date.

* cited by examiner

*Primary Examiner*—Anh Q. Tran
(74) *Attorney, Agent, or Firm*—Patterson & Sheridan, L.L.P.

(57) ABSTRACT

Input circuit and method for setting a termination voltage. One embodiment provides a method for setting a termination voltage of an input circuit of an integrated circuit, the input circuit having an input terminal for receiving a signal, the termination voltage being applied to the input terminal, the received signal being driven with respect to the termination voltage and being evaluated by a comparison with a reference potential, the termination voltage being generated and being set in accordance with a control signal, the control signal being generated in a manner dependent on a comparison of one or more signal levels of the received signal with an assessment potential, the termination voltage being set by means of the control signal in such a way that the reliability of the signal reception is maximized.

20 Claims, 1 Drawing Sheet

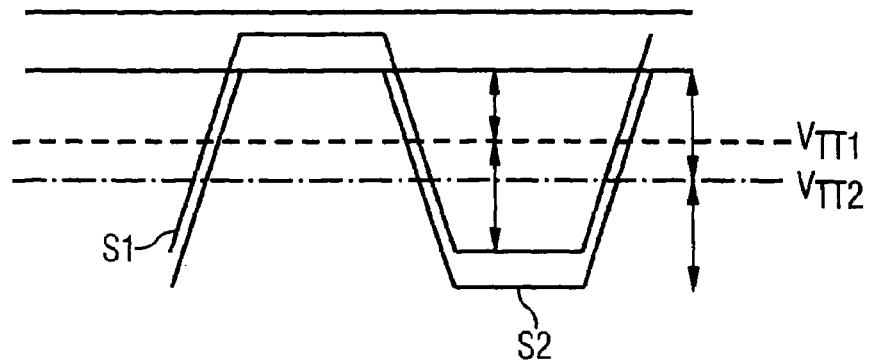
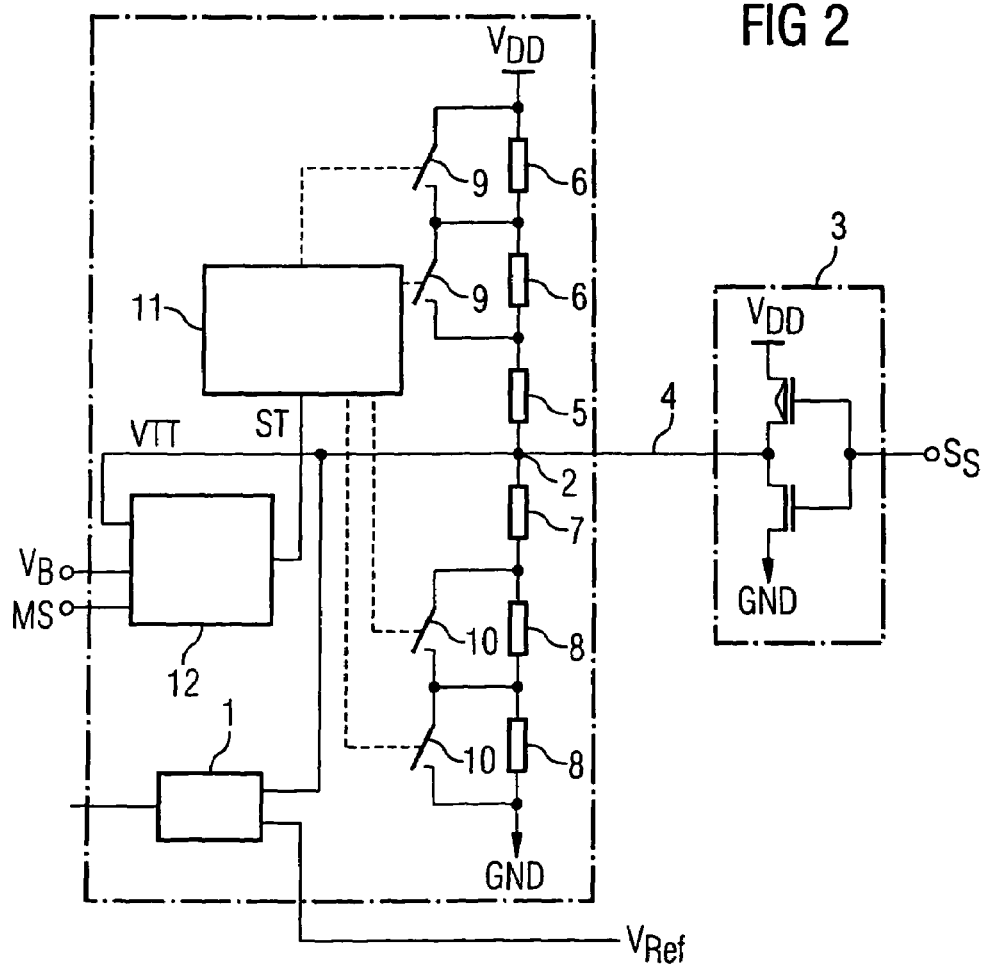

METHOD FOR SETTING A TERMINATION VOLTAGE AND AN INPUT CIRCUIT

CROSS-REFERENCE TO RELATED APPLICATIONS

This application claims foreign priority benefits under 35 U.S.C. §119 to co-pending German patent application number 103 18 523.2-32 DE, filed Apr. 24, 2003. This related patent application is herein incorporated by reference in its entirety.

BACKGROUND OF THE INVENTION

1. Field of the Invention

The invention relates to a method for setting a termination voltage for an input circuit of an integrated circuit. The invention furthermore relates to an input circuit for an integrated circuit which provides an optimized termination voltage.

2. Description of the Related Art

Particularly in the case of data connections between DRAM memory modules and the associated memory controller, the data transfer takes place at a high frequency. The reception of the signals is sensitive to systematic signal distortions, such as, e.g., asymmetries between the low level and the high level of the received signal.

The data transfer between the memory controller and the DRAM memory module is performed by a driver circuit in the transmission part and an input circuit in the reception part. The driver circuit pulls the potential of the corresponding data line to a high or to a low potential with respect to the impedance of the data line and the input impedance of the input circuit. The range in which the high level or the low level of the transferred signal lies is determined by the component parameters of the driver circuit and also by the electrical resistances of the data line and input circuit. The center potential about which the signal to be transferred varies is prescribed by the input circuit in the form of a termination voltage. The high and low levels of the signal are more or less symmetrical with regard to the termination voltage depending on the intrinsic driver power of a pull-up path and a pull-down path of the driver circuit and/or depending on the noise of the respective supply potential which is connected to the data line via the pull-up or pull-down path.

The received signal present at an input terminal of the input circuit is usually compared with an externally prescribed reference voltage assess the signal value of the received signal. The termination voltage is generated in the input circuit independently of the externally prescribed reference voltage. Consequently, the termination voltage and the reference voltage may be different depending on process-dictated component deviations. If termination voltage and reference voltage are not identical, then the received signal may be asymmetrical with respect to the reference voltage. However, the reference voltage is provided in identical fashion for all the input circuits of the integrated circuit, with the result that deviations of individual termination voltages cannot be compensated for by changing the reference voltage.

SUMMARY OF THE INVENTION

It is an object of the present invention to provide for adapting an input circuit of an integrated circuit, so that the reception behavior is adapted in the case of non-optimum input signals such that it is possible to receive signals with a better quality. Furthermore, it is an object of the present invention to provide an input circuit which can be adapted to input signals that are asymmetrical with regard to a prescribed reference voltage.

A first aspect of the present invention provides a method for setting a termination voltage of an input circuit of an integrated circuit. The input circuit has an input terminal for receiving a signal. The termination voltage is applied to the input terminal, the received signal being driven with respect to the termination voltage and being evaluated by a comparison with a reference voltage. The termination voltage is generated and set in accordance with a control signal, the control signal being generated in a manner dependent on a comparison of one or more signal levels of the received signal with an assessment potential. The termination voltage is set by means of the control signal in such a way that the reliability of the signal reception is maximized.

The invention affords the possibility of checking the signal levels of the received signal on the basis of a reference variable prescribed by the assessment potential, and of generating as a result a control signal which can be used to set the termination voltage generated by the input circuit. In this way, it becomes possible to set the termination voltage in particular after an analysis of a plurality of signal levels with the aid of a plurality of assessment potentials, so that the reliability of the signal reception can be increased.

The assessment potential may be chosen in such a way as to check that a potential of a low level of the received signal lies below a potential threshold prescribed by the assessment potential. The assessment potential thus determines a range below the potential threshold in which the low level of the received signal must always lie in order still to be able to be detected reliably by comparison with the reference potential. If, e.g., in the case of a signal sequence having a plurality of low levels, one of the low levels is not below the potential threshold prescribed by the assessment potential, then the termination voltage is lowered by means of the control signal, so that the low levels of the input signal are likewise lowered.

In the same way, the assessment potential may be chosen in such a way as to check whether a potential level of a high level of the received signal lies above a potential threshold prescribed by the assessment potential. In this way, it is possible to ascertain whether the high levels of the input signal reliably lie above a potential threshold determined by the assessment potential. The termination voltage is increased by means of the control signal if the potential level of the high level of the received signal lies below the predetermined potential threshold.

A further aspect of the present invention provides a method for adjusting an input circuit. The method for setting the termination voltage as described above is carried out in an adjustment phase. In a normal operating phase, the termination voltage may be maintained by means of a suitable control signal.

Furthermore, a plurality of assessment potentials may be applied successively to generate the control signal as a result of the comparison of one or more signal levels of the received signal with the assessment potentials.

A further aspect of the present invention provides an input circuit for an integrated circuit for receiving a signal. The input circuit includes a termination unit, which applies a termination voltage to an input terminal of the input circuit. The termination unit can be driven by a control signal to set the termination voltage in accordance with the control signal. An analysis unit is connected to the input terminal to generate the control signal in a manner dependent on a comparison of one or more signal levels of the received signal with an assessment potential. The analysis unit sets the termination voltage by means of the control signal in such a way that the reliability of the signal reception is maximized.

In this way, an input circuit is provided for adapting the termination voltage in such a way that the received signal can be detected more reliably.

The termination unit may have a first resistor chain having a first and a second resistor, and a second resistor chain having a third and a fourth resistor. The first and second resistor chains are connected in series between a high supply potential and a low supply potential, wherein the termination voltage may be tapped off between the first and second resistor chains. A termination control unit is provided to short-circuit the second resistor and the fourth resistor in a manner dependent on the control signal to set the termination voltage. The termination control unit may drive a first switching device arranged in parallel with the second resistor and a second switching device arranged in parallel with the fourth resistor. A plurality of second resistors and a plurality of fourth resistors may be provided, each of which can be short-circuited by the termination control unit.

BRIEF DESCRIPTION OF THE DRAWINGS

Preferred embodiments of the invention are explained in more detail below with reference to the accompanying drawings, in which:

FIG. 1 is a graphical representation of an input signal with respect to a termination voltage and with respect to a reference voltage; and FIG. 2 is a block diagram illustrating an input circuit in accordance with one embodiment of the invention.

DETAILED DESCRIPTION OF THE PREFERRED EMBODIMENT

In the event of a data transfer between a memory controller and a DRAM memory module, the data are transmitted onto a data line with the aid of a driver circuit in the transmission part and received via an input terminal of an input circuit in the reception part. The driver circuit is usually connected in such a way as to pull the voltage level of a termination voltage on the data line, which is provided by the input circuit, to a high potential or a low potential, depending on what signal value is intended to be transmitted. On account of the resistances and inductances of the data line and of the input terminal of the input circuit, the high potential and the low potential made available to the driver circuit are not completely reached.

In order for the signal levels of the signal to be transferred to vary in a defined manner about a center potential, the input circuit provides the termination voltage which is applied to the data line. The driver circuit then drives the signal with respect to said termination voltage. Asymmetries of the signal with regard to the termination voltage usually occur on account of disturbances of the high supply potential and of the low supply potential at the driver circuit or on account of production-dictated different driver powers of the pull-up path and of the pull-down path, depending on whether the signal is intended to be brought to a high level or a low level.

The termination voltage is usually generated in the input circuit, generally by means of a voltage divider. The received signal is evaluated with the aid of a comparator circuit, the signal levels of the received signal being evaluated with regard to a reference voltage that is made available externally. Said reference voltage is essentially invariable, so that the assessment of the signal levels becomes less reliable in the event of a shift in the signal levels of the received signal.

By adapting the termination voltage, it is possible to shift high and low levels of the signal in such a way that a symmetry with respect to the reference potential is achieved and that the high and low levels lie in an optimum range for the evaluation unit.

FIG. 1 illustrates that a signal S1, the high level of which is too high on account of noise or the like, is altered by a reduction of the termination voltage from a first termination voltage value $V_{TT1}$ to a second termination voltage value $V_{TT2}$ such that the high level and also the low level are reduced. The resulting signal profile S2 is exhibited by the transmitted signal if it is driven with respect to the second termination voltage value.

It is taken into consideration that the high level of the received signal does not lie below a predetermined potential threshold, so that the signal can still be assessed correctly with the aid of the reference potential.

FIG. 2 illustrates a reception circuit for an integrated circuit, in particular for a DRAM memory circuit. The input circuit has an evaluation unit 1, which compares the signal received via an input terminal 2 with a reference potential $V_{Ref}$ and, depending on whether the received signal level is greater or less than the reference potential $V_{Ref}$, interprets the signal value of the received signal as a logic "1" or a logic "0". The evaluation unit 1 may have a comparator device for this purpose. In order that a noise signal superposed on the signal to be received does not lead to an erroneous interpretation of the signal value or to the signal value jumping back and forth, in the evaluation unit 1, a change to a logic "1" is detected only above a high evaluation potential and a change to a logic "0" is detected below a low evaluation potential.

The signal is driven to the input terminal 2 in a driver circuit 3 via the data line 4. The driver circuit applies a high supply potential $V_{DD}$ or a low supply potential GND to the data line 4 in accordance with the signal $S_S$ to be transmitted. The driver circuit 3 drives the signal on the data line with respect to a termination voltage VTT, which is generated by a series of resistors connected between the high supply potential $V_{DD}$ and the low supply potential GND.

The series of resistors has a first resistor 5 and two second resistors 6, the first resistor 5 and the second resistors 6 being connected in series between the high supply potential $V_{DD}$ and the input terminal 2. A third resistor 7 is furthermore provided, which is connected with two fourth resistors 8 in series between the input terminal 2 and the low supply potential GND.

First switching devices 9 are respectively arranged in parallel with the second resistors 6, and second switching devices 10 are respectively arranged in parallel with the fourth resistors 8 to short-circuit the selected second or fourth resistors 6, 8, when the switching devices are closed (or switched on). As a result of the respective switching device 9, 10 being switched on, the second or fourth resistor 6, 8 connected in parallel therewith is removed from or left in the series of resistors, so that the voltage level forming at the input terminal 2 is set depending on the resistance of the first to fourth resistors 5, 6, 7, 8 or according to which of the second or fourth resistors 6, 8 are short-circuited or not. The first and second switching devices 9, 10 are driven by a control unit 11. The control unit 11 switches the first and second switching devices 9, 10 in accordance with a control signal ST. The control signal ST is provided by an analysis unit 12.

The analysis unit 12 serves to generate the control signal ST with which the termination voltage VTT can be set by means of the control unit 11. The control signal ST is set in the analysis unit 12 such that the signal transmitted by the driver circuit 3 can be received as reliably as possible.

The signal is checked with the aid of the analysis unit 12 by an assessment potential $V_B$ being made available to the analysis unit 12. In an adjustment mode indicated by a mode signal MS of the analysis unit 12, a first assessment potential $V_{B1}$ is applied to the analysis unit 12, which potential specifies a first potential threshold below which a low level ought to lie in order to ensure a reliable signal reception by the evaluation unit 1. For this purpose, a defined signal sequence is applied to the input circuit by the driver circuit 3 in the adjustment mode. A plurality of low levels of the applied signal sequence in the adjustment mode are compared with the first assessment potential $V_{B1}$ in a comparator circuit of the analysis unit 12, and a corresponding control signal ST is generated to lower the termination voltage VTT if one of the low levels of the applied signal does not lie below the threshold defined by the first assessment potential $V_{B1}$.

In this first assessment, the comparison in the analysis unit 12 is carried out only for the low levels of the applied signal sequence. If the applied signal sequence contains high levels, then the latter are not considered during this assessment. This may be carried out, for example, by the first assessment potential $V_{B1}$ being applied to the integrated circuit externally. An evaluation signal (not shown) which is likewise applied to the analysis unit 12 then makes it possible to define the points in time for assessment of the received signal with the aid of the first assessment potential $V_{B1}$.

Afterward, a second assessment potential VB2 is applied to the analysis unit 12 to check the high level of the transmitted signal in the adjustment mode. If one of the high levels of the transmitted signal lies below the threshold prescribed by the second assessment potential VB2, then a control signal is generated to raise the termination voltage VTT.

The raising and lowering of the termination voltage VTT may be effected incrementally, and a counter pulse may be output as control signal at the analysis unit 12, which pulse increments or decrements a counter in the control unit 11 and, in accordance with the counter value, short-circuits or does not short-circuit one or more defined resistances of the voltage divider and thereby sets the termination voltage VTT by means of the first and second switching devices 9, 10.

In one embodiment, in the adjustment mode, the first assessment potential $V_{B1}$ and the second assessment potential $V_{B2}$ are applied alternately successively multiple times to check the signal levels for the low level and the high level.

The control signal ST may also transfer a control value to the control unit 11, wherein control value represents an absolute value of the termination voltage VTT to be set. Such a control signal ST may be determined, for example, from the potential difference between the assessment potential and the low or high level of the received signal.

In a normal operating mode, likewise indicated by the mode signal MS of the analysis unit 12, the analysis unit 12 may be deactivated, and the control signal ST is set in such a way that the termination voltage VTT is held at the potential reached. A counter in the control unit 11 is neither incremented nor decremented by the control signal ST in this case.

What is claimed is:

1. A method for setting a termination voltage of an input circuit of an integrated circuit, comprising:
   comparing one or more signal levels of a received signal against one or more assessment potentials;
   generating a control signal based on a comparison of the one or more signal levels of the received signal and the one or more assessment potentials; and
   setting the termination voltage according to the control signal,
   wherein the comparison determines whether a low level potential of the received signal lies below a low potential threshold prescribed by a low assessment potential, and
   wherein the termination voltage is decreased by the control signal if the low level potential of the received signal is above the low potential threshold.

2. The method of claim 1, wherein the termination voltage is set by one of short-circuiting one or more resistors connected in series between a high supply potential and an input terminal and short-circuiting one or more resistors connected in series between the input terminal and a low supply potential.

3. The method of claim 1, further comprising:
   receiving a signal to get the input circuit in an adjustment mode, wherein the method for setting the termination voltage is carried out in the adjustment mode.

4. The method of claim 3, wherein the one or more assessment potentials comprise one or more low assessment potentials and one or more high assessment potentials.

5. The method of claim 4, wherein the one or more signal levels of the received signals are compared against the one or more low assessment potentials and the one or more high assessment potentials alternately.

6. The method of claim 1, wherein the comparison determines whether a high level potential of the received signal lies above a high potential threshold prescribed by a high assessment potential, and wherein the termination voltage is increased by the control signal if the high level potential of the received signal lies below the high potential threshold.

7. A method for setting a termination voltage of an input circuit of an integrated circuit, comprising:
   comparing one or more signal levels of a received signal against one or more assessment potentials;
   generating a control signal based on a comparison of the one or more signal levels of the received signal and the one or more assessment potentials; and
   setting the termination voltage according to the control signal,
   wherein the comparison determines whether a high level potential of the received signal lies above a high potential threshold prescribed by a high assessment potential, and
   wherein the termination voltage is increased by the control signal if the high level potential of the received signal lies below the high potential threshold.

8. The method of claim 7, wherein the termination voltage is set by one of short-circuiting one or more resistors connected in series between a high supply potential and an input terminal and short-circuiting one or more resistors connected in series between the input terminal and a low supply potential.

9. The method of claim 7, further comprising:
receiving a signal to get the input circuit in an adjustment mode, wherein the method for setting the termination voltage is carried out in the adjustment mode.

10. The method of claim 9, wherein the one or more assessment potentials comprise one or more low assessment potentials and one or more high assessment potentials.

11. The method of claim 10, wherein the one or more signal levels of the received signals are compared against the one or more low assessment potentials and the one or more high assessment potentials alternately.

12. An input circuit for an integrated circuit, comprising:
an analysis unit connected to receive one or more signal levels of a received signal and to provide a control signal to the control unit, wherein the analysis unit compares the one or more signal levels of a received signal against one or more assessment potentials and generates a control signal based on a comparison of the one or more signal levels of the received signal and the one or more assessment potentials;
a control unit for setting a termination voltage to an input terminal of the input circuit according to the control signal provided from the analysis unit;
a first resistor chain having a first resistor and one or more second resistors; and
a second resistor chain having a third resistor and one or more fourth resistors;
wherein the first and second resistor chains are connected in series between a high supply potential and a low supply potential;
wherein the termination voltage is tapped off between the first and second resistor chains; and
wherein the control unit is configured to short-circuit the one or more second resistors and the one or more fourth resistors according to the control signal to set the termination voltage.

13. The input circuit of claim 12, further comprising:
one or more first switching devices arranged in parallel with the one or more second resistors respectively; and
one or more second switching devices arranged in parallel with the one or more fourth resistors respectively;
wherein the control unit is configured to selectively switch on and switch off each of the one or more first and second switching devices according to the control signal.

14. The input circuit of claim 12, wherein the analysis unit is configured to determine whether a low level potential of the received signal lies below a low potential threshold and whether a high level potential of the received signal lies above a high potential threshold.

15. The input circuit of claim 14, wherein the analysis unit includes a mode signal input for receiving a signal to set the input circuit in an adjustment mode during which the termination voltage is determined.

16. The input circuit claim 12, further comprising:
an evaluation circuit configured to compare a reference voltage against the received signal with the termination voltage and to provide an output representing logic states based on the comparison.

17. An input circuit for an integrated circuit, comprising:
an analysis means for receiving one or more signal levels of a received signal and for providing a control signal to the control unit, wherein the analysis unit compares the one or more signal levels of a received signal against one or more assessment potentials and generates a control signal based on a comparison of the one or more signal levels of the received signal and the one or more assessment potentials;
a control means for setting a termination voltage to an input terminal of the input circuit according to the control signal provided from the analysis means;
a first resistor means and a second resistor means connected in series between a high supply potential and a low supply potential;
wherein the termination voltage is tapped off between the first and second resistor means; and
wherein the control means is configured to change one or more resistance values of the first and second resistor means according to the control signal to set the termination voltage.

18. The input circuit of claim 17, wherein the first resistor means comprises a first resistor and one or more second resistors and the second resistor means comprises a third resistor and one or more fourth resistors; and wherein the control means is configured to short-circuit the one or more second resistors and the one or more fourth resistors according to the control signal to set the termination voltage.

19. The input circuit of claim 18, further comprising:
one or more first switching means arranged in parallel with the one or more second resistors respectively; and
one or more second switching means arranged in parallel with the one or more fourth resistors respectively;
wherein the control means is configured to selectively switch on and switch off each of the one or more first and second switching devices according to the control signal.

20. The input circuit of claim 17, wherein the analysis means is configured to determine whether a low level potential of the received signal lies below a low potential threshold and whether a high level potential of the received signal lies above a high potential threshold.

* * * * *